United States Patent
Park et al.

[19]

[11] Patent Number: 5,961,657
[45] Date of Patent: Oct. 5, 1999

[54] PARALLEL TEST CIRCUIT FOR SEMICONDUCTOR MEMORY DEVICE

[75] Inventors: Chan-Jong Park; Se-Jin Jeong, both of Seoul, Rep. of Korea

[73] Assignee: Samsung Electronics, Co., Ltd., Suwon, Rep. of Korea

[21] Appl. No.: 08/770,671

[22] Filed: Dec. 20, 1996

[30] Foreign Application Priority Data

Dec. 23, 1995 [KR] Rep. of Korea ...................... 95/55738

[51] Int. Cl.⁶ ............................. G11C 29/00; G06F 11/00
[52] U.S. Cl. ........................... 714/718; 714/820; 714/42; 365/201; 370/244
[58] Field of Search ........................... 371/21.1, 24, 67.1, 371/68.1, 68.2; 370/241, 242, 244, 248; 364/238, 238.1, 238.2; 395/183.05, 183.18, 183.19; 365/200, 201, 220, 189.02, 189.03, 189.04

[56] References Cited

U.S. PATENT DOCUMENTS

| | | | |
|---|---|---|---|
| 5,202,888 | 4/1993 | Ochiai | 714/718 |
| 5,428,575 | 6/1995 | Fudeyasu | 714/718 |
| 5,436,911 | 7/1995 | Mori | 714/719 |
| 5,471,480 | 11/1995 | You | 365/201 |
| 5,511,029 | 4/1996 | Sawada et al. | 365/201 |
| 5,588,115 | 12/1996 | Augarten | 714/42 |

*Primary Examiner*—Trinh L. Tu
*Attorney, Agent, or Firm*—Marger Johnson & McCollom, P.C.

[57] ABSTRACT

There is disclosed a parallel test circuit for a semiconductor memory device having a memory army with a plurality of memory cells and a plurality of comparators used for high-speed memory cell test, including a plurality of fist comparators performing first comparison with respect to data transmitted through a plurality of data output lines formed near memory blocks of the memory array; a plurality of second comparators coupled in common with each output terminal of the first comparators and performing second comparison with respect to output data of the first comparators; a multiplexer multiplexing output of the second comparator; first and second switches alternatively connected to an output terminal of the multiplexer; and a data output buffer coupled in common with output terminals of the first and second switches and buffering outputs of the first and second switches. The multiplexer is connected to the first switches for a first mode operation, and is connected to the second switch for a second mode operation to thereby perform a two-way data test.

6 Claims, 10 Drawing Sheets

PARALLEL TEST CIRCUIT FOR SEMICONDUCTOR MEMORY DEVICE

BACKGROUND OF THE INVENTION

1. Field of the Invention

The present invention generally relates to a parallel test circuit for semiconductor memory devices. More particularly, it relates to a multiple bit parallel test circuit for semiconductor memory devices which is an improved lay-out suitable for memory test performance for semiconductor devices of high integration.

The present application is based on Korean Application No. 55738/1995.

2. Description of the Related Art

In recent years, semiconductor memory devices, particularly, dynamic random access memory devices, have dramatically increased in density and accuracy. The chip size has become large, and test processing time for checking the memory devices has increased thereby. Malfunction of memory cells commonly results from a single-bit failure, since accessing the bits one by one in order to test for defects prolongs the test processing time and raises testing costs. To meet the needs of a test circuit which is able to check for failures in chips within a short period of time, a multiple-bit parallel test circuit has been proposed.

In the operation of this multiple bit parallel test circuit, the same data is written into all the memory cells, then the data stored in each memory cell is read out during one access cycle. The multiple-bit parallel test circuit performs a comparison operation with the read data. When the data does not match the value which was read into the memory cells in the previous operation, the multiple-bit parallel test circuit interprets this as a "failure".

Figure 1:
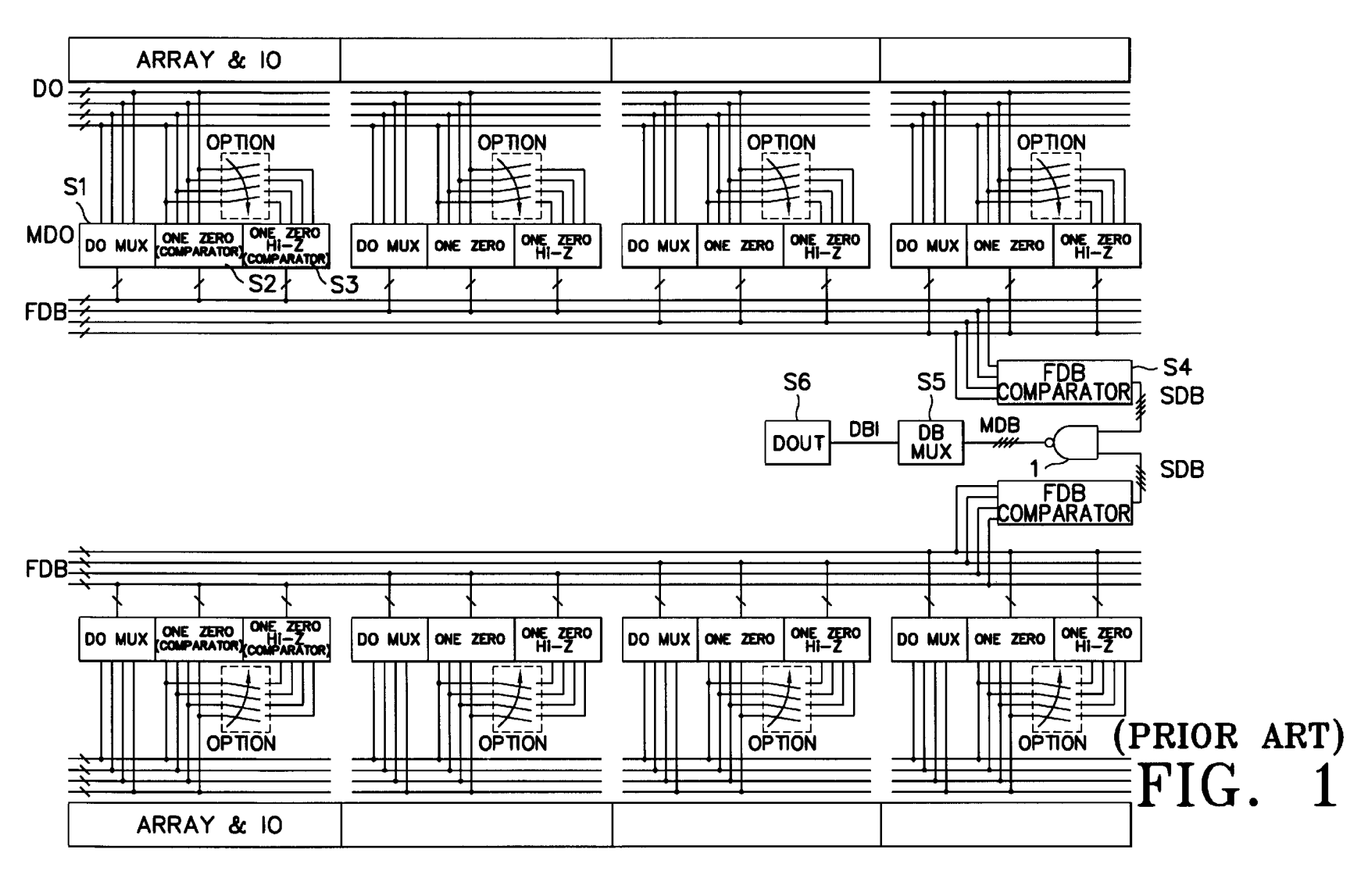
FIG. 1 depicts a data path of a conventional parallel test circuit.

FIG. 1 depicts the data path of a conventional parallel test circuit in which a one/zero/hi-Z test circuit is added to each one/zero test circuit as an option.

In this parallel test circuit, multiple bits are accessed simultaneously during a parallel test mode. Parallel test circuits are classified into two types: the one/zero test circuit S2 in which an output of its data output buffer, "0" or "1" is representative of "Pass" or "Fail", and a one/zero/hi-Z test circuit S3 in which a data pattern can be detected when the output of the data output buffer in the parallel test circuit is "0" or "1". In this type of test, high-impedance data ("hi-Z") is produced when the output of the data output buffer is defective. Neither of these two circuits is a standard one, and these two circuits are employed according to circumstances. In the presently-available test technique, a hi-Z test circuit is added to each one/zero test circuit as an option.

FIG. 1 is a schematic representation of a memory array which includes multiple memory banks. Each memory bank is divided into a predetermined number of memory blocks. The memory array of FIG. 1 includes two memory banks each having four memory blocks. Each memory block includes a predetermined number of data lines (DO lines), to which a DO line multiplexer S1 (DO MUX) is electrically connected. A one/zero test circuit S2 is connected in common with the DO lines as well as a one/zero/hi-Z test circuit S3. Each output terminal of the DO MUIX S1, the one/zero test circuit S2 and the one/zero/hi-Z test circuit S3 is connected is in common to a predetermined number of first data buses (FDB).

Since there arm four memory blocks in each memory bank of FIG. 1, the number of the FDBs is four. The FDBs are electrically connected to the input terminals of a first data bus comparator S4 (FDB comparator). The FDB comparator S4, has an output terminal connected to a second data bus (SDB), and the SDB and SDB are connected to a merged data bus (MDB) via NAND gate 1. The MDB is connected at one end to the input terminal of a data bus multiplexer S5 (DB MUX). The DB MUX S5 has an output terminal DB1 connected to the input terminal of a data output buffer DOUT S6. The lower part of FIG. 1's circuit is of construction similar to the above-described upper part.

FIGS. 2 to 7 are circuit diagrams respectively of: an enable clock generating circuit for FIG. 1's comparator, an enable signal generating circuit for the comparator, the comparators S2 and S3, the FDB comparator, the MDB circuit, and the DB multiplexer. Their circuitry is well known to those skilled in this art.

During normal mode, data of the DO lines are sent to the FDBs via the DO MUX S1, and are sent to the DOUT S6 through the SDB and MDB. The data is transferred to the DOUT S6 and is transmitted to outside.

When the one/zero/Hi-Z test circuit is added to the basic one/zero test commit during the parallel test mode, the data of the DO lines is first pressed by the comparators S2 and S3, and the output data of the comparators S2 and S3 are conveyed to the FDBs. The FDB comparator S4, performs the second comparison with respect to the data of the FDBs. The output data of the FDB comparator S4 is conveyed to the SDB. The data of the SDB is conveyed to the MDB via the NAND gate 1, and is then transferred to outside by way of the DB MUX S5 and DOUT S6. Data stored in the memory arrays of the above process undergo a test through the steps of comparison. The operation of the comparators may be simply carried out by using the exclusive OR circuits shown in FIG. 4 or 5.

During a conventional parallel test, a change in the output data is by the optional circuit.

Figure 2:
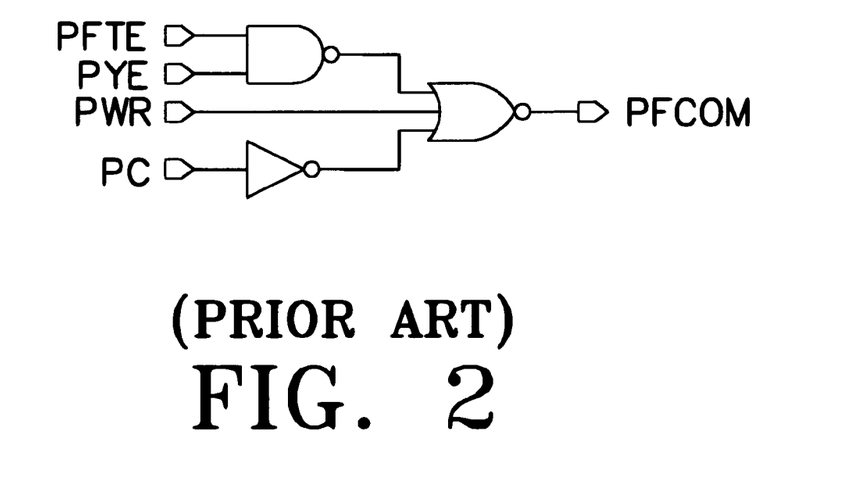
FIG. 2 is the logic diagram of an enable clock generating circuit of the comparator in the circuit of FIG. 1.

The output of FIG. 2's enable clock generating circuit is enabled to a "high" level when the external test enable signal PFTE, indicative of the parallel test mode, and the column (Y) enable PYE signal are synchronized with the row address strobe signal RASB, and attain a "high" level each, and an output PWR of a WEB buffer indicative of a read mode and an output PC of a CASB buffer that buffers a column address strobe signal CASB attain a "low" level and a "high" level respectively.

Figure 3:
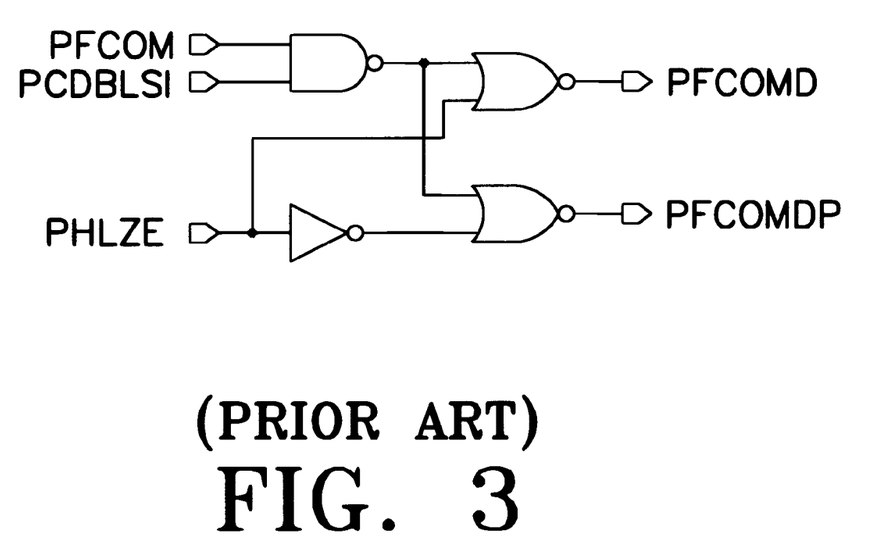
FIG. 3 is a circuit diagram of an enable signal generating circuit of the comparator in the circuit of FIG. 1.
Figure 4:
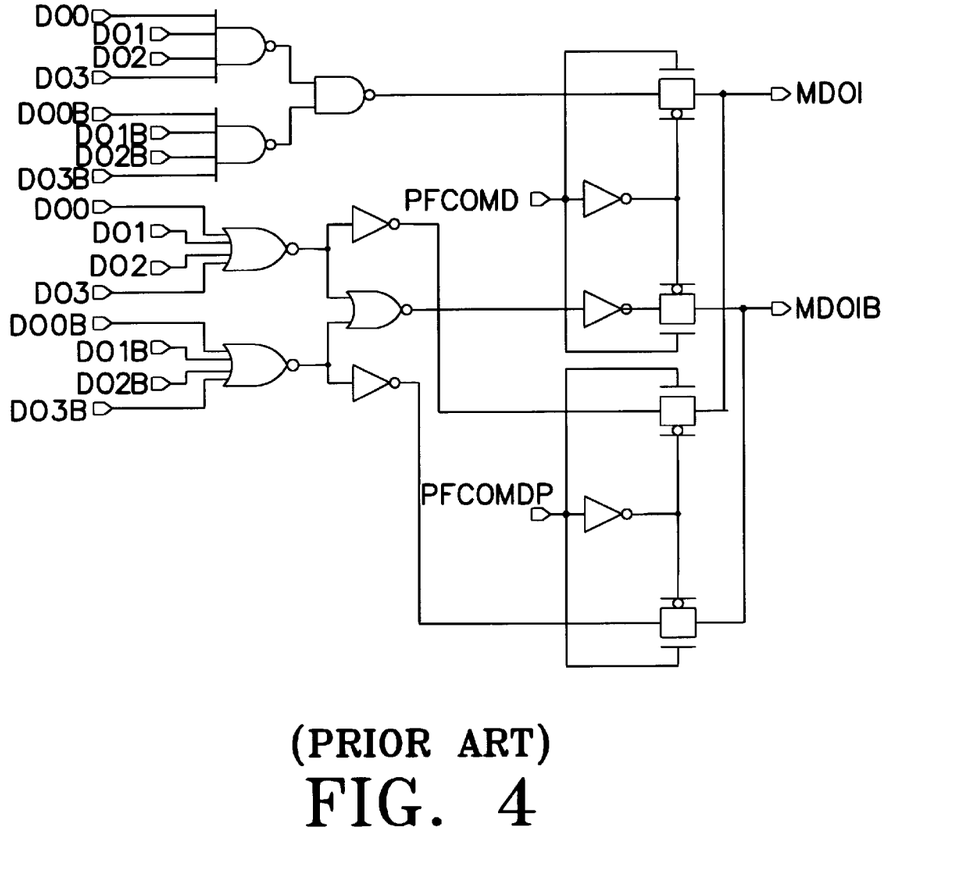
FIG. 4 is a detailed circuit diagram of the comparator in the circuit of FIG. 1.
Figure 5:
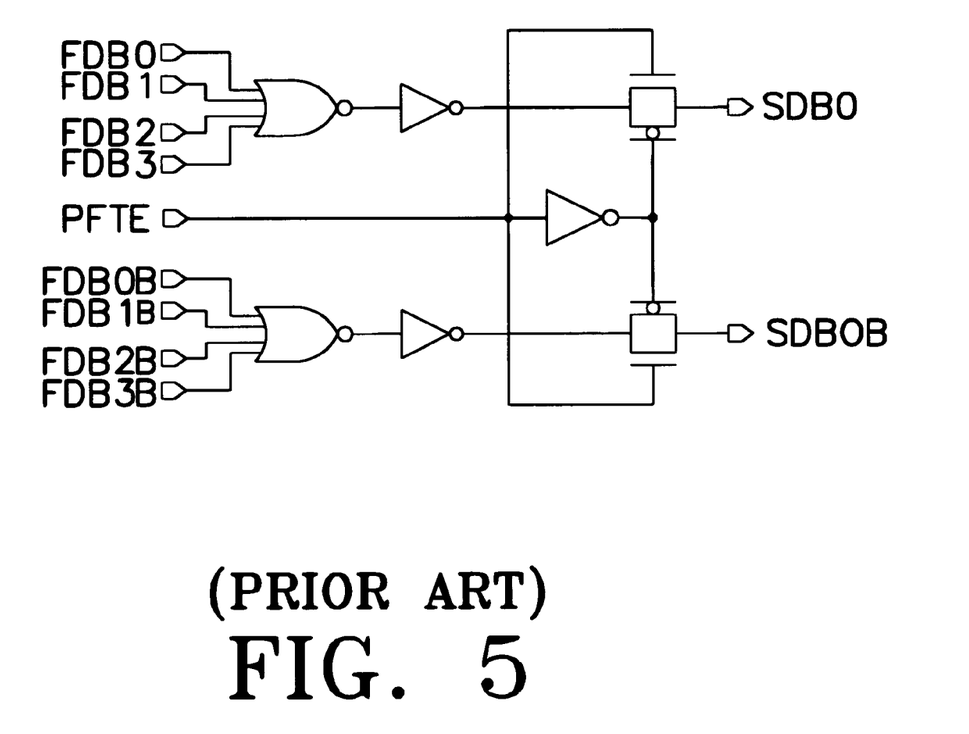
Figure 6:
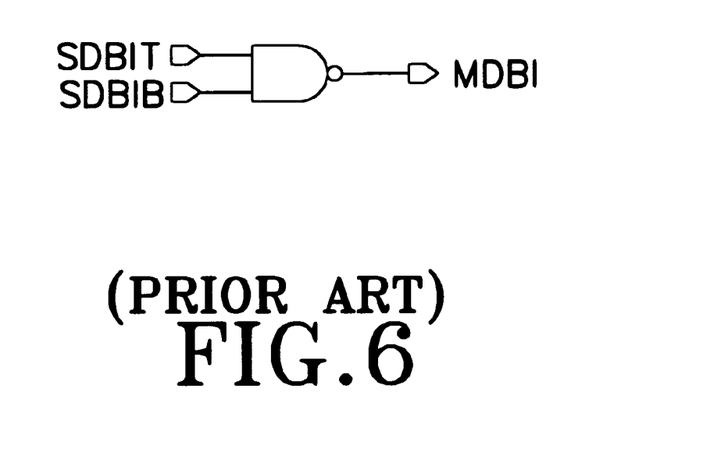
FIG. 6 is a detailed circuit diagram of a MDB circuit in the circuit of FIG. 1.
Figure 7:
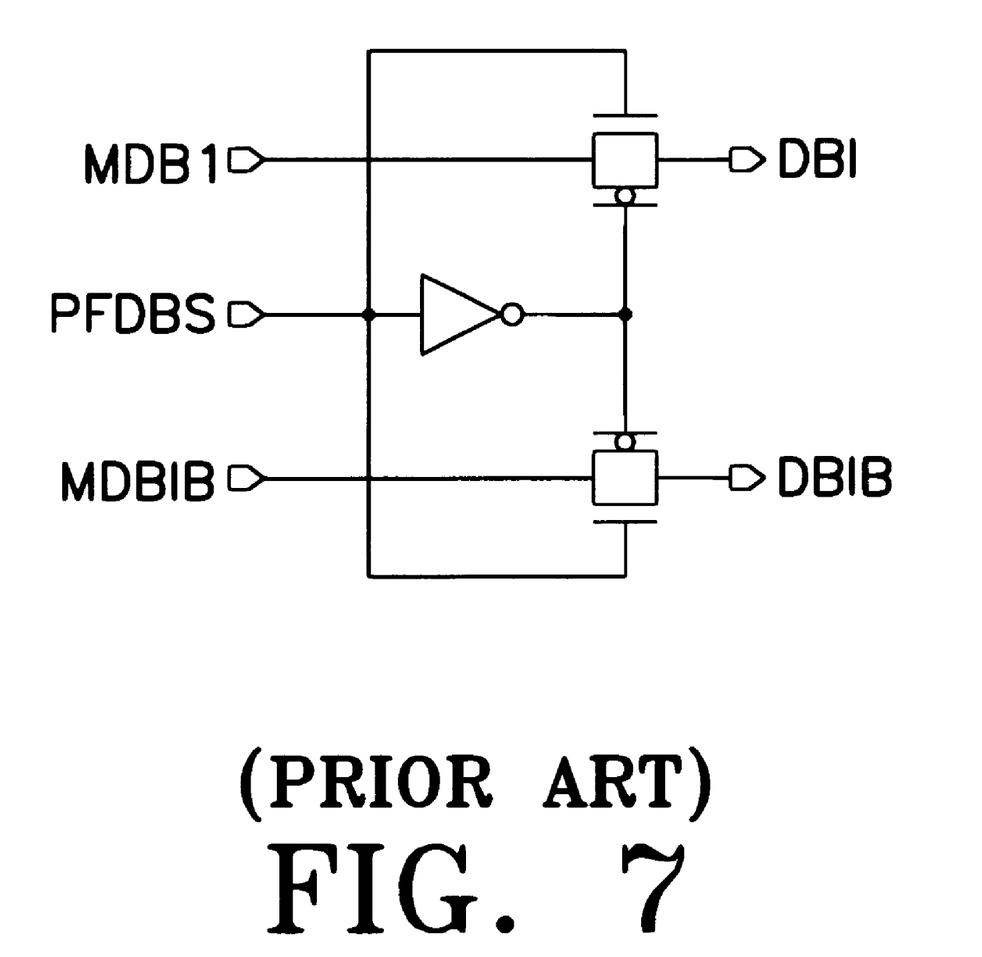
FIG. 7 is a detailed circuit diagram of a DB multiplexer in the circuit of FIG. 1.

FIG. 3 is a circuit diagram of the enable signal generating circuit of FIG. 1's comparator S2 or S3.

Once the multiple bit parallel test is carried out, in one/zero mode, a signal PFCOMD is enabled to a "high" level. During the one/zero/Hi-Z mode, as an enable signal PHLZE goes "high", a signal PFCOMDP is enabled to a "high" level. The DO MUX S1, one/zero comparator S2 and one/zero/Hi-Z comparator S3 are necessary for each DO line. Each one of the DO lines requires FIG. 4's circuitry. The path from the first part of the data path to the data output buffer should be modified as circumstances require, which makes the circuit lay-out and circuit control difficult. The data processed through the comparators is conveyed to the FDBs. The FDB comparator performs the second comparison with respect to the data of the FDBs.

According to the conventional parallel test circuit, in order to perform the one/zero test or one/zero/Hi-Z test without error, comparators for each mode are connected to appropriate memory blocks. In this configuration, the data buses of the comparators have complicated connections to increase their lay-out in size and the controlling process becomes complicated.

SUMMARY OF THE INVENTION

The present invention is directed at a parallel test circuit for a semiconductor memory devices which substantially obviates the above-described limitations and disadvantages of the related art.

It is an object of the present invention to provide a parallel lest circuit for semiconductor memory devices which simplifies construction and also reduces chip size.

Another object of the present invention is to provide a multiple bit parallel test with a simple control mechanism reducing memory test time for semiconductor memory devices.

In order to realize the above objectives, the present invention discloses a parallel test circuit for a semiconductor memory device having a memory array with multiple memory cells and multiple comparators used for high-speed memory cell testing. This circuit includes: multiple first comparators performing the first comparison with respect to the data transmitted through multiple data output lines which are formed near the memory blocks of the memory arry; multiple second comparators coupled in common with each output terminal of the first comparators to perform a second comparison with respect to output data of the first comparators; a multiplexer performing multiplexing with respect to an output of the second comparator; first and second switches which am alternatively connected to an output terminal of the multiplexer; and a data output buffer coupled to the output terminals of the first and second switches and the buffering outputs of the first and second switches. The multiplexer is connected to the first switches for the first mode operation, and to the second switch for a second mode operation, to thereby perform a two-way data test.

DESCRIPTION OF THE DRAWINGS

FIG, 5 is a detailed circuit diagram of a FDB comparator in the circuit of FIG. 1.

DETAILED DESCRIPTION OF THE PREFERRED EMBODIMENT

Reference will now be made in detail to the preferred embodiment of the present invention, examples of which are illustrated in FIGS. 8–15 of the accompanying drawings.

Figure 8:
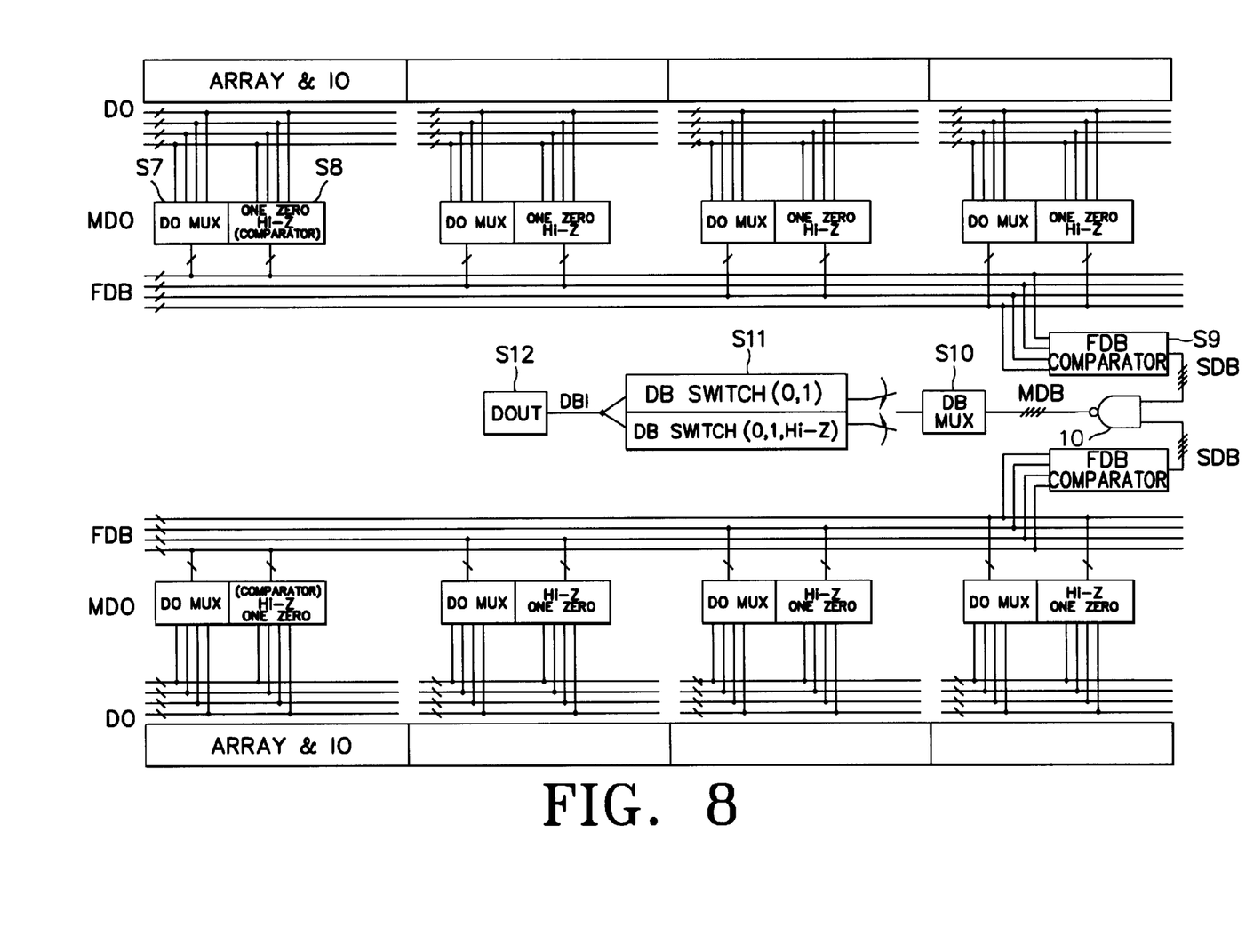
FIG. 8 depicts a data path of a parallel test circuit in accordance with a first preferred embodiment of the present invention.

FIG. 8 depicts a data path of a parallel test circuit in accordance with a first preferred embodiment of the present invention.

A memory array of FIG. 8 includes multiple memory banks, and each memory bank is divided into a predetermined number of memory blocks. A 4- or 16-Mega byte memory device could be divided into 4 memory banks and 16 memory blocks. A memory array of two memory banks and four memory blocks is shown in FIG. 8.

In each memory block there are a predetermined number of data output (DO) lines, a DO line multiplexer S7 (DO MUX) is electrically connected to the DO lines, and a one/zero/hi-Z comparator S8 also connected to the DO lines. Each output terminal of the DO MUX S7 and the one/zero/Hi-Z comparator S8 is connected in common with a predetermined number of first data buses (FDB).

In the circuitry of FIG. 1, since there are four memory blocks, the number of the FDBs is four. The FDBs are electrically connected to an input terminal of the first data bus comparator S9 (FDB comparator). The FDB comparator S9 has an output terminal connected to second data buses SDBs. The SDBs are connected to a merged data bus (MDB) via NAND gate 10. The MDB is connected by DB MUX S10 to the data bus (DB) switch (0/1) and the DB switch (0/1/Hi-Z) S11. The DB switch (0/1) and the DB switch (0/1/Hi-Z) have each output end connected to the input terminal of data output buffer DOUT S12. The lower part of FIG. 8's circuit is of construction similar to the above-described upper part. Description of the specific structure of the DB switch S11 is unnecessary because the operation and function are analogous to those of circuit S1 and S2 as shown in FIG. 1 and known in the art.

Differences between the circuits of FIGS. 1 and 8 are described as follows. As shown in FIG. 8, two switches are alternatively connected between the DB MUX S10 and DOUT S12, instead of the one/zero comparator incorporated in the circuitry of FIG. 1. Accordingly, the DB switch (0/1) is connected to the DB MUX S10 to monitor whether or not there is a fault in data. When detecting data failure and data pattern concurrently, the DB switch (0/1/Hi-Z) is connected to the DB MUX S10. Through this alternate connection, all the one/zero modes and one/zero/Hi-Z modes can be performed without the one/zero comparator incorporated in FIG. 1's circuitry. Therefore, the DO MUX S10 and the one/zero/Hi-Z comparator are coupled to the DO lines for normal operation. The operations corresponding to each mode are carried out by two DB switches. In this manner, the invented parallel test circuit has a lay-out which is reduced in size, maintaining the same circuit performance.

Figure 9:
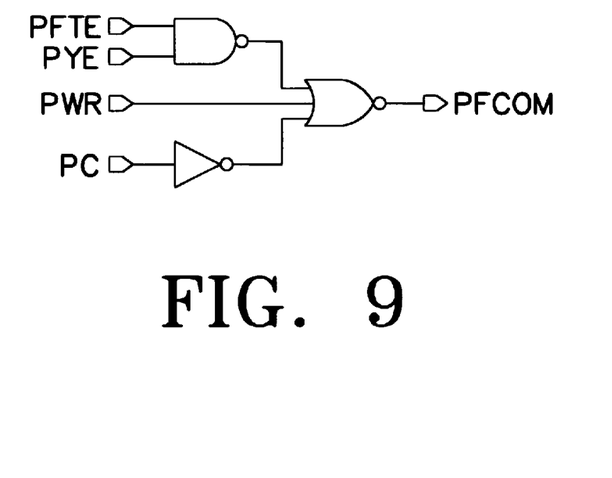
FIG. 9 is a circuit diagram of an enable clock generating circuit of a comparator in the circuit of FIG. 8.
Figure 10:
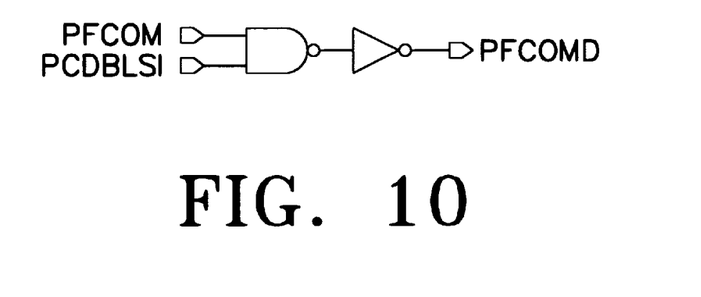
FIG. 10 is a circuit diagram of an enable signal generating circuit of a comparator in the circuit of FIG. 8.
Figure 11:
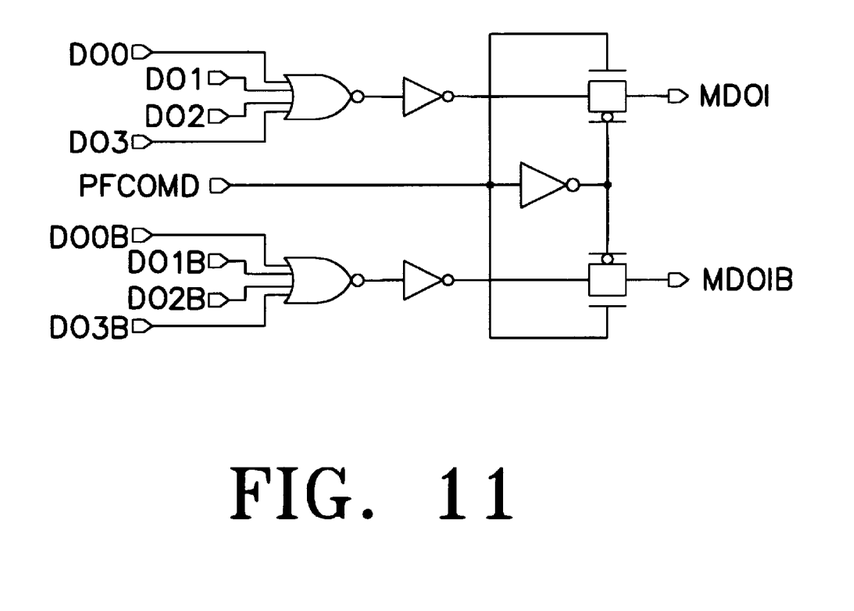
FIG. 11 is a detailed circuit diagram of the comparator in the circuit of FIG. 8.
Figure 12:
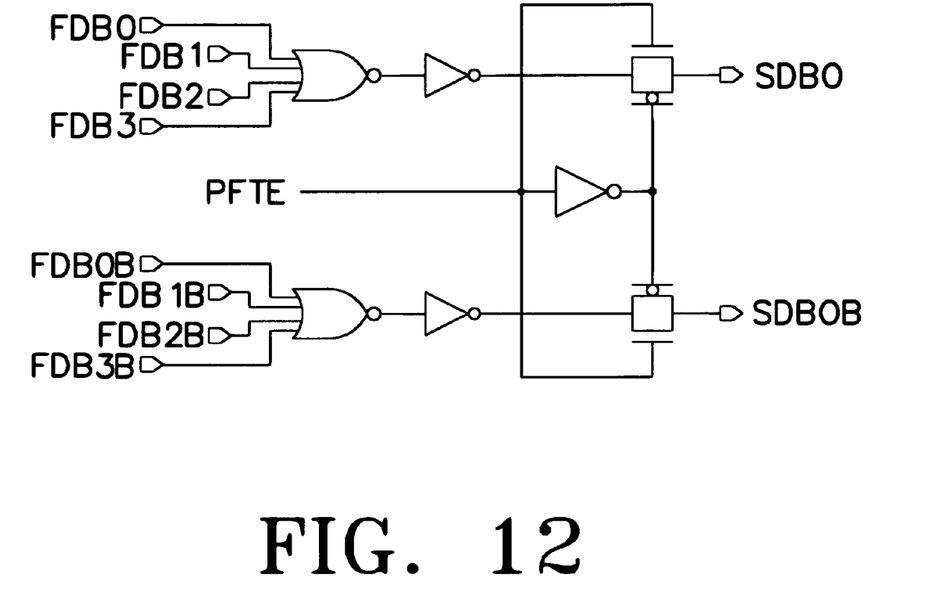
FIG. 12 is a detailed circuit diagram of a FDB comparator in the circuit of FIG. 8.
Figure 13:
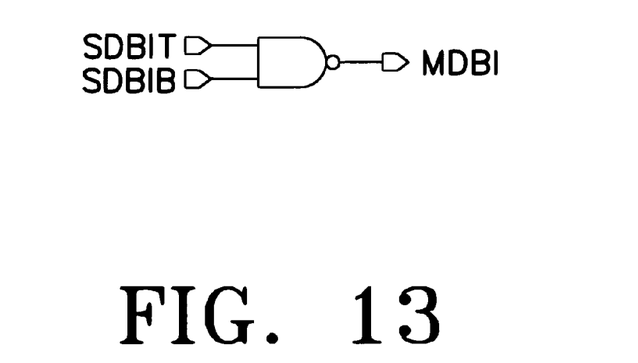
FIG. 13 is a detailed circuit diagram of a MDB circuit in the circuit of FIG. 8.
Figure 14:
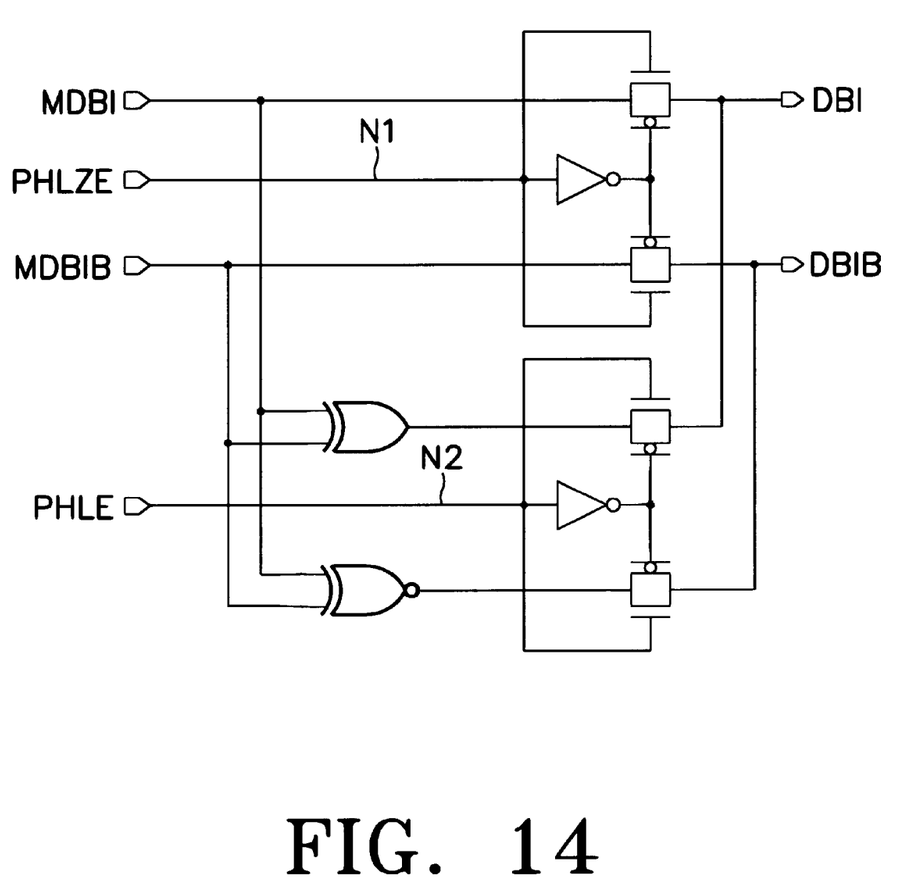
FIG. 14 is a detailed circuit diagram of a DB multi-plexer in the circuit of FIG. 8.

FIG. 9 is the circuit diagram of an enable clock generating circuit of a comparator S8 which is incorporated into the circuit of FIG. 8. FIG. 10 is a circuit diagram of an enable signal generating circuit of a comparator incorporated into the circuit of FIG. 8. FIG. 11 is a detailed circuit diagram of the comparator incorporated into the circuit of FIG. 8. FIG. 12 is a detailed circuit diagram of a FDB comparator incorporated into the circuit of FIG. 8. FIG. 13 is a detailed circuit diagram of a MDB circuit incorporated into the circuit of FIG. 8. FIG. 14 is a detailed circuit diagram of a DB multi-plexer incorporated into the circuit of FIG. 8.

The DO comparator and DO MUX S10 which are included in each memory block are connected to DO lines as shown in FIG. 8. Data of the DO lines is sent to the FDBs, the SDB and MDB through the FDB comparators S9. The data is transmitted to the data output buffer DOUT through a data path via either DB switch (0,1) or DB switch (0, 1, Hi-Z) in either one/zero mode or one/zero/Hi-Z mode as determined by the DB MUX S10.

A signal from the PFCOM of FIG. 9's enable clock generating circuit is enabled to a "high" level when an external signal PFTE, and signal PYE are synchronized with the row address strobe signal RASB, and the output PC of the CASB buffer which buffers the column address strobe signal, CASB, to attain a "high" level while the output PWR of the WEB buffer attains a "low" level.

Referring now to FIG. 11, if all the data of the DO lines attains a "high" level during parallel test processing, a signal MDOi goes "high", and a signal MDOiB goes "low". When all the data of the DO lines attain a "low" level during parallel test processing, the signal MDOi goes "low", and the signal MDOiB goes "high". If the data of the DO lines are defective, the signals MDOi and MDOiB attain a logic high state each in the one/zero/Hi-Z mode. A signal PHLZE of FIG. 14 is a one/zero/Hi-Z mode enable signal, and is applied from outside.

According to the invented parallel test circuit, the data pattern created during the parallel test mode can be selected through mode selections with the DB switches. The numbers of bus lines and comparators connected to the DO lines is reduced, which is advantageous to high integration techniques and simplifies operation to thereby ensure high-speed performance.

Figure 15:
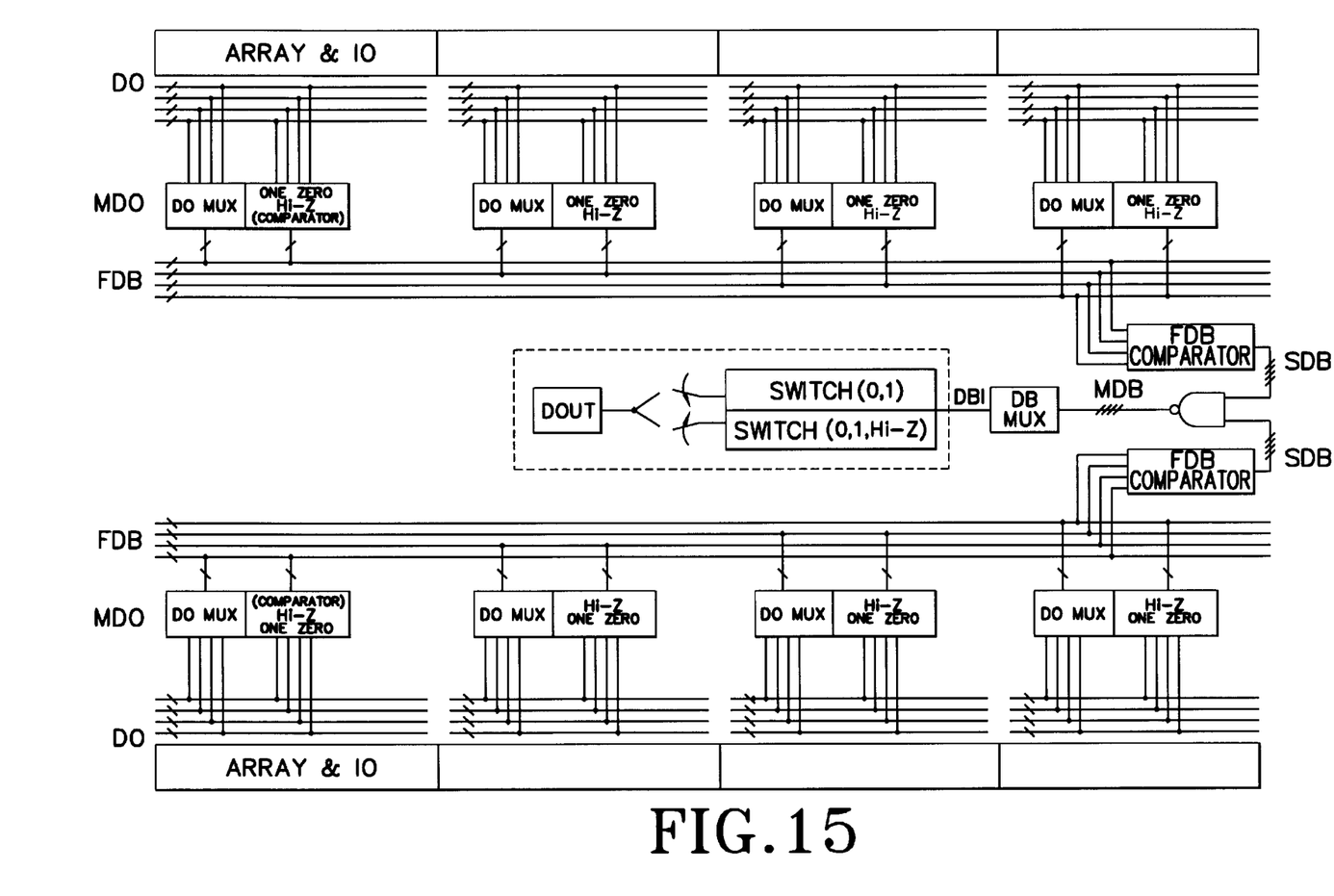
FIG. 15 depicts a data path of a parallel test circuit in accordance with a second preferred embodiment of the present invention.

FIG. 15 depicts a data path of a parallel test circuit in accordance with a second preferred embodiment of the present invention. In this second preferred embodiment, contrary to the first preferred embodiment of FIG. 8, output data is conveyed to DB lines in a one/zero/Hi-Z mode, and the mode selections are then made through switches of its data output buffer to thereby produce output data in the selected mode. The second preferred embodiment ensures the reduction of chip size and high-speed performance.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A parallel test circuit for high-speed testing a semiconductor memory device having a memory array with multiple memory cells and multiple comparing means, the parallel test circuit comprising:
   multiple first comparing means for performing a first comparison of data transmitted through multiple data output lines, the data output lines being formed near memory blocks of said memory array;
   second comparing means coupled with said multiple first comparing means for performing a second comparison of data output from said first comparing means;
   multiplexing means for providing data output from said second comparing means to a multiplexing means output terminal;
   first switching means having a first input terminal and a first output terminal;
   second switching means having a second input terminal and a second output terminal, the first and second input terminals being alternatively connected to the multiplexing means output terminal; and
   a data output buffer coupled to the first and second output terminals of said first and second switching means, respectively, for buffering data output from said first and second switching means;
   wherein said multiplexing means is connected to said first switching means in a first mode and to said second switching means in a second mode.

2. A parallel test circuit according to claim 1 wherein the first mode is a one/zero mode and wherein the first switching means is connected between the multiplexing means and the data output buffer in said first mode.

3. A parallel test circuit according to claim 1 wherein the second mode is a one/zero/hi-impedance mode and wherein the second switching means is connected between the multiplexing means and the data output buffer in said second mode.

4. A parallel test circuit for high-speed memory cell testing a semiconductor memory device having a memory array with multiple memory cells and multiple comparing means, the test circuit comprising:
   multiple first comparing means performing a first comparison of data transmitted through multiple data output lines, the data output lines being formed near memory blocks of said memory array;
   second comparing means coupled to said multiple first comparing means for performing a second comparison of data output from said first comparing means;
   multiplexing means for providing data output from said second comparing means to a multiplexing means output terminal;
   first switching means having a first input terminal and a first output terminal;
   second switching means having a second input terminal and a second output terminal, the first and second input terminals being connected to the multiplexing means output terminal; and
   a data output buffer having a third input terminal, the first and second output terminals of the first and second switching means, respectively being alternately connected to the third input terminal, the data output buffer for buffering the output of said multiplexing means;
   said multiplexing means being connected to said first switching means during a first mode and to said second switching means during a second mode.

5. A parallel test circuit according to claim 4 wherein the first mode is a one/zero mode and wherein the first switching means is connected between the multiplexing means and the data output buffer during said first mode operation.

6. A parallel test circuit according to claim 4 wherein the second mode is a one/zero/high-impedance mode and wherein the second switching means is connected between the multiplexing means and the data output buffer during said second mode.

* * * * *

UNITED STATES PATENT AND TRADEMARK OFFICE
CERTIFICATE OF CORRECTION

PATENT NO.    : 5,961,657
DATED         : October 5, 1999
INVENTOR(S)   : Park et al.

It is certified that error appears in the above-identified patent and that said Letters Patent is hereby corrected as shown below:

Column 1,
Line 65, "arm four" should read -- are four --.

Column 2,
Line 21, "commit" should read -- circuit --.
Line 21, "mode. the" should read -- mode, the --.

Signed and Sealed this

Twenty-first Day of January, 2003

JAMES E. ROGAN
*Director of the United States Patent and Trademark Office*